(12) United States Patent
Butler

(10) Patent No.: US 9,195,128 B2
(45) Date of Patent: Nov. 24, 2015

(54) ENHANCING ALIGNMENT IN LITHOGRAPHIC APPARATUS DEVICE MANUFACTURE

(75) Inventor: Hans Butler, Best (NL)

(73) Assignee: ASML Netherlands B.V., Veldhoven (NL)

(*) Notice: Subject to any disclaimer, the term of this patent is extended or adjusted under 35 U.S.C. 154(b) by 791 days.

(21) Appl. No.: 12/730,910

(22) Filed: Mar. 24, 2010

(65) Prior Publication Data

US 2010/0290022 A1   Nov. 18, 2010

Related U.S. Application Data

(60) Provisional application No. 61/177,780, filed on May 13, 2009.

(51) Int. Cl.
  G03B 27/32    (2006.01)
  G03F 9/00     (2006.01)

(52) U.S. Cl.
  CPC  *G03B 27/32* (2013.01); *G03F 9/70* (2013.01); *G03F 9/7096* (2013.01)

(58) Field of Classification Search
  CPC ........... G03F 7/70041; G03F 7/70141; G03F 7/70358; G03F 7/70758; G03F 7/70775; G03F 9/7096; G03B 27/32
  USPC ................ 355/52, 53, 55, 67–71, 72–75, 77; 250/492.1, 492.2, 492.22, 548
  See application file for complete search history.

(56) References Cited

U.S. PATENT DOCUMENTS

| | | | | |
|---|---|---|---|---|
| 4,631,416 A | * | 12/1986 | Trutna, Jr. | 250/548 |
| 4,777,374 A | * | 10/1988 | Nakata et al. | 250/548 |
| 4,991,962 A | * | 2/1991 | Jain | 356/490 |
| 5,227,838 A | * | 7/1993 | Nakanishi et al. | 355/53 |
| 5,699,145 A | * | 12/1997 | Makinouchi et al. | 355/53 |
| 5,883,701 A | | 3/1999 | Hasegawa et al. | |
| 5,896,438 A | * | 4/1999 | Miyake et al. | 378/34 |
| 6,191,844 B1 | * | 2/2001 | Ueda | 355/67 |
| 6,268,906 B1 | * | 7/2001 | Suzuki | 355/67 |

(Continued)

FOREIGN PATENT DOCUMENTS

| | | |
|---|---|---|
| JP | 62-241330 A | 10/1987 |
| JP | 02-226713 A | 9/1990 |
| JP | 03-212925 A | 9/1991 |
| JP | 09-092611 A | 4/1997 |
| JP | 09-219361 A | 8/1997 |
| JP | 11-317365 A | 11/1999 |
| JP | 2003-324056 A | 11/2003 |
| JP | 2006-100830 A | 4/2006 |

OTHER PUBLICATIONS

English-Language Translation of Notification of Reason(s) for Refusal directed to related Japanese Patent Application No. 2010-108166, mailed Jan. 31, 2012, from the Japanese Patent Office; 3 pages.

*Primary Examiner* — Christina Riddle
(74) *Attorney, Agent, or Firm* — Sterne, Kessler, Goldstein & Fox P.L.L.C.

(57) ABSTRACT

In a lithographic apparatus, a scanning mechanism is coarse compared with precise patterns to be exposed onto a substrate. In order to ensure that the image and the substrate are aligned at some point in time, an oscillation is imparted to either the substrate table, or to a device that aligns the image, such as a mask table. The oscillation frequency is chosen to compliment a maximum alignment error. The frequency of a radiation pulse is arranged to coincide with the image and the substrate being most accurately aligned. The radiation pulse of the image may be timed to coincide with the alignment without the use of the imparted oscillation.

18 Claims, 3 Drawing Sheets

(56) References Cited

U.S. PATENT DOCUMENTS

| | | | |
|---|---|---|---|
| 6,359,688 B2* | 3/2002 | Akimoto et al. | 356/401 |
| 6,556,279 B1* | 4/2003 | Meisburger et al. | 355/69 |
| 6,881,963 B2* | 4/2005 | Ito | 250/491.1 |
| 7,355,674 B2 | 4/2008 | De Klerk | |
| 2002/0145713 A1* | 10/2002 | Kurosawa | 355/53 |
| 2006/0066828 A1* | 3/2006 | Klerk | 355/53 |
| 2006/0151718 A1* | 7/2006 | Kondo et al. | 250/492.2 |
| 2007/0008509 A1* | 1/2007 | Shiraishi | 355/69 |
| 2007/0162781 A1* | 7/2007 | Visser et al. | 714/3 |
| 2007/0182947 A1* | 8/2007 | Hempenius et al. | 355/75 |
| 2009/0174876 A1* | 7/2009 | Schriever et al. | 355/69 |

\* cited by examiner

ENHANCING ALIGNMENT IN LITHOGRAPHIC APPARATUS DEVICE MANUFACTURE

CROSS REFERENCE TO RELATED APPLICATION

This application claims the benefit of provisional application 61/177,780 filed on May 13, 2009. The subject matter of that application is incorporated herein by reference as if fully set forth herein.

BACKGROUND

1. Field of Invention

The present invention relates to a lithographic apparatus and a method for manufacturing a device using lithography. Specifically, the present invention relates to the alignment of a substrate or wafer in the path of a patterned radiation beam.

2. Description of Related Art

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The scanning of the pattern may follow what is known as a "meander", which is a possible path taken by the scanning stage to ensure that the entire target portion is included in the scan and is therefore exposed.

In order for the correct portion of the substrate to be exposed, the mask and the substrate must always be aligned. In other words, the accuracy of the product position on the substrate as described above is at least in part determined by the relative position of the substrate and the patterning device during exposure of the pattern. In particular, the accuracy (or lack thereof) of a position of an image of the pattern on the substrate at the moment of exposure is dependent on the relative positional error of the substrate support and the patterning device support at the very instant a radiation beam is transmitted through the patterning device onto the substrate surface. Position errors impact overlay (i.e. the accuracy of one exposed layer on another) and critical dimension uniformity (i.e. the width of product structures on the substrate surface).

However, there are always alignment errors because the movements of the mask (table) and the substrate (support) necessarily move more slowly than the exposure radiation. The supports (or tables) that support the substrate and the patterning device respectively are controlled such that they move with minimum positional error and with constant velocity. In the meantime, the radiation (which is often in the form of a laser) fires pulses at a constant frequency (pulse repetition rate). Accidental or unintentional movement in any of the mechanical devices may occur just at the timing of the radiation and although the radiation beam (or laser) may be in the correct position, the mask and substrate may not, at that precise moment, be perfectly aligned.

There is an increasing requirement for smaller and more precise patterns to be exposed on the substrate. As products become smaller, relative movements of the substrate table and the patterning device table become less tolerable and a cause of errors. In other words, it becomes increasingly difficult to keep the support positional errors below decreasing tolerances. One reason for this is that the supports (or tables) are mechanical components that do not allow instantaneous repositioning or very rapid movements. In addition, disturbance forces like acoustics or noise in electronic components limit the obtainable accuracy. However, the support that supports the patterning device and the support that supports the substrate both need to be aligned during the radiation pulse (i.e. during the exposure of the pattern on the substrate surface) and it is in this alignment that accuracy errors may occur. These errors are often caused by unintentional motion of one of the supports in response to acoustical and/or mechanical vibrations by electronic sources.

SUMMARY

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention. Consistent with the principles of the present invention as embodied and broadly described herein, the present invention includes It is desirable to ensure accurate alignment between a radiation pulse, a patterning device (on its support), and a substrate (on its respective support). It is alternatively desirable to ensure accurate alignment between a projected image and the substrate.

According to an aspect of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus further comprises an oscillation device configured to impart a controlled oscillation perpendicular to an optical axis of the projection system to at least one of the patterning device support and the substrate table in the projection system.

This controlled oscillation is imparted such that, in use, a probability of the patterned radiation beam being aligned with the target portion of the substrate at some time during the oscillatory movement is increased.

According to an aspect of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein: the lithographic apparatus further comprises a relative position detector configured to detect a relative position between the patterned radiation beam and the target portion of the substrate; and the illumination system is further configured to impart a timed pulse to the radiation beam, the pulse being timed to coincide with a minimal positional offset between the patterned radiation beam and the target portion of the substrate.

According to an aspect of the invention, there is provided a method of projecting a patterned radiation beam onto a substrate comprising imparting a controlled relative oscillatory motion between the projected patterned radiation beam and the substrate, the relative oscillatory motion being in a direction perpendicular to a direction of projection of the projected patterned radiation beam.

According to an aspect of the invention, there is provided a device manufacturing method comprising projecting a patterned beam of radiation onto a substrate, and oscillating an image of the patterned radiation beam with respect to a substrate on which the patterned radiation beam is projected in a direction perpendicular to a projection direction of the patterned beam of radiation. There may further be provided a device manufactured according to the method above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
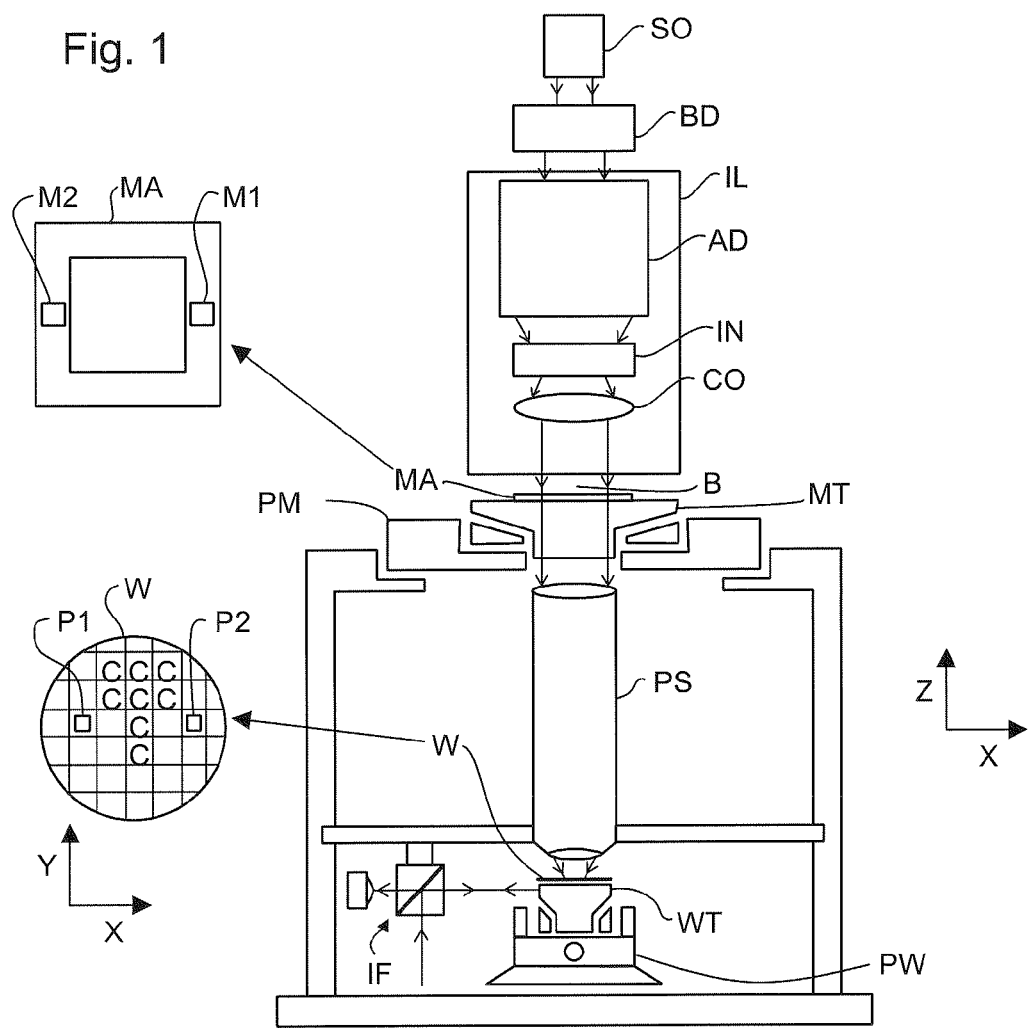
FIG. 1 depicts a lithographic apparatus according to an embodiment of the invention.

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function. The present invention relates to FIG. 1 schematically depicts a lithographic apparatus according to one embodiment of the invention. The apparatus comprises:
- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Such an immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the present invention may be applied to any of the modes described above. An embodiment relates to the timing of a laser pulse forming the radiation beam being controlled such that the laser pulse is fired when the image embodied in the patterning device and the target portion of the substrate are aligned. An embodiment of the present invention relates to controlling the relative positions of the patterning device and the substrate as well as the timing of pulses of the radiation beam such that an image of the pattern that is exposed on the substrate is positioned as accurately as possible. Such control may be performed by a feedback control loop or a feed-forward control loop. Either the substrate table WT or the support structure MT of the patterning device (e.g. a mask table), or both, may be moving (e.g. scanning along a meander, or stepping between static positions) in order to expose a pattern over the full surface of the substrate. Errors may be introduced during this movement (or may be present in the static position). Specifically, the movement actuated by the long- or short-stroke actuators that move the support structure MT or the substrate table WT may not be accurate enough for very small or precise patterns to be exposed accurately.

Typically, the mask table MT and the substrate table WT are complex mechanical structures with large masses that are moved small distances and that exhibit internal resonances. The positions of the tables MT, WT are controlled by measuring (e.g. using an interferometer) the actual position of each table (taking into account multiple degrees of freedom) and comparing the measured positions with pre-set motion set points. The mask table MT and substrate table WT positions are measured generally at a rate that is independent of the pulse rate of the radiation beam. For example, the table MT, WT positions may be measured at a rate of 5 kHz, whereas the radiation beam pulse may have a frequency of 5 kHz. When the positions are found to contain errors, a correcting actuator force is produced to minimize the error by moving at least one of the tables. However, using an actuator (which needs to be able to quickly accelerate large masses) to move the large masses very small distances in order to minimize a positional error is difficult below a certain threshold minimum error. Furthermore, there are other causes of movement in the tables MT, WT. These movements may be vibrations caused by the high forces used to accelerate the tables, or acoustic vibrations (air pressure variations induced by the scanning motion), as well as sensor and amplifier noise. The present invention seeks to overcome these difficulties.

The radiation that is used to expose a substrate is often a laser and so reference to the radiation pulses herein below may be to laser pulses or laser firing. Typically, a laser pulse frequency is 4 kHz or more, and a substrate support scanning speed is of the order of 500 mm/s. At a typical slit width of, for example, 5 mm, each portion of a pattern is exposed for 0.01 s, and so includes on the order of 40 laser pulses.

In an embodiment of the invention, variation in the timing of laser pulses is used as an extra variable to improve the position of the image (of the pattern) on the substrate during exposure. Only when the substrate is aligned with the mask (within permissible tolerances) is the laser triggered. This is practical if it is certain that a position "close to" the original laser pulse timing (without adjustment for alignment errors) is available at which the relative table position error (i.e. the misalignment between the mask table and the substrate table) is zero. The laser pulse timing may be brought forward or delayed if the mask table and the substrate table are aligned at a time other than the expected moment. However, in an embodiment the laser pulse timing may only be brought forward or delayed by a specific margin so as not to decrease throughput (i.e. the overall time taken to expose the target portion of the substrate).

In order to take advantage of the variability of the laser pulse timing, an embodiment of the present invention further involves the oscillation of one or both tables to increase the probability that the mask table and the substrate table will be perfectly aligned at some point in time and space during the oscillation. At this point in the oscillation, the laser pulse is fired. This has the advantage of increasing the throughput because the system will not require the laser pulse to be delayed or brought forward by as large a margin as if there were no oscillation.

By the induction of an oscillation, what is meant is that a controlled oscillation is applied to either the patterned radiation beam or the substrate so that a relative oscillation between the two is created. The oscillation may be induced by introducing a controlled cyclical movement or a perturbation to a table or to the radiation beam. The perturbation may be to an existing movement. For example, the oscillation may be induced in addition to the meander of the substrate (with respect to the radiation beam). The meander may be carried out by moving the substrate table that supports the substrate in a meander path while the radiation beam is held in one position. The oscillation may then be superimposed onto the meander movement of the substrate table, or the oscillation may be applied to the radiation beam. The oscillation is more than a simple vibration, as a vibration is often uncontrolled—i.e. an amplitude may be initially set and the vibration is then allowed to find its natural resonance. The imparted oscillation of the present embodiment on the other hand is carefully controlled so that it has a predetermined and constant frequency that is linked to a maximum frequency error of the device or table being oscillated and also to a frequency of the laser pulses.

Figure 3:
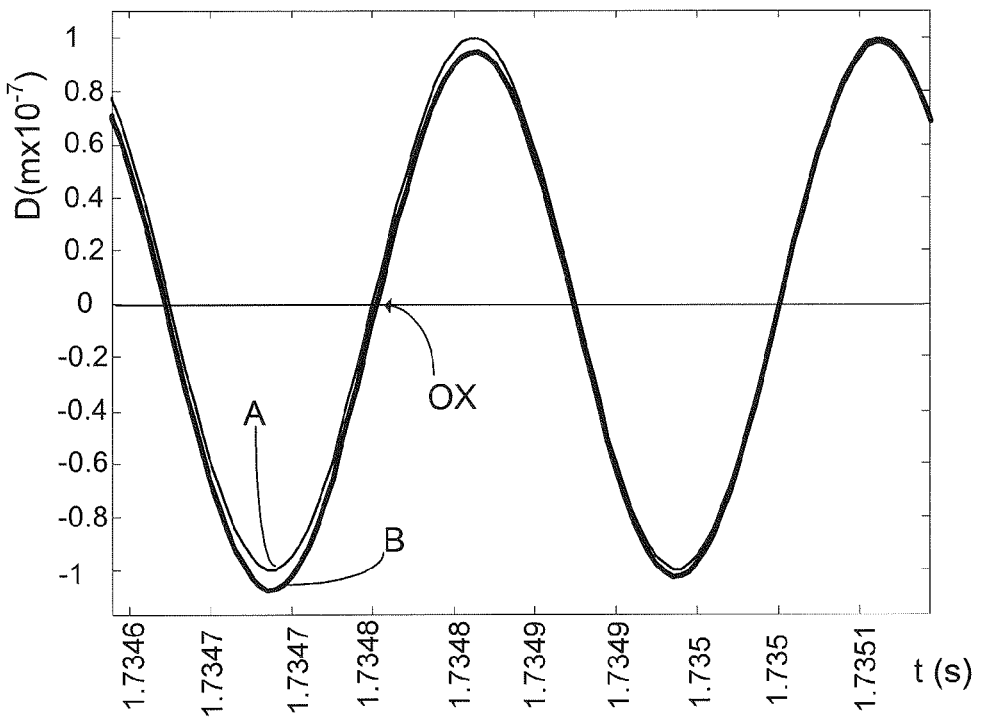
FIG. 3 depicts a graph of displacement over time of a substrate support according to an embodiment of the invention.
Figure 4:
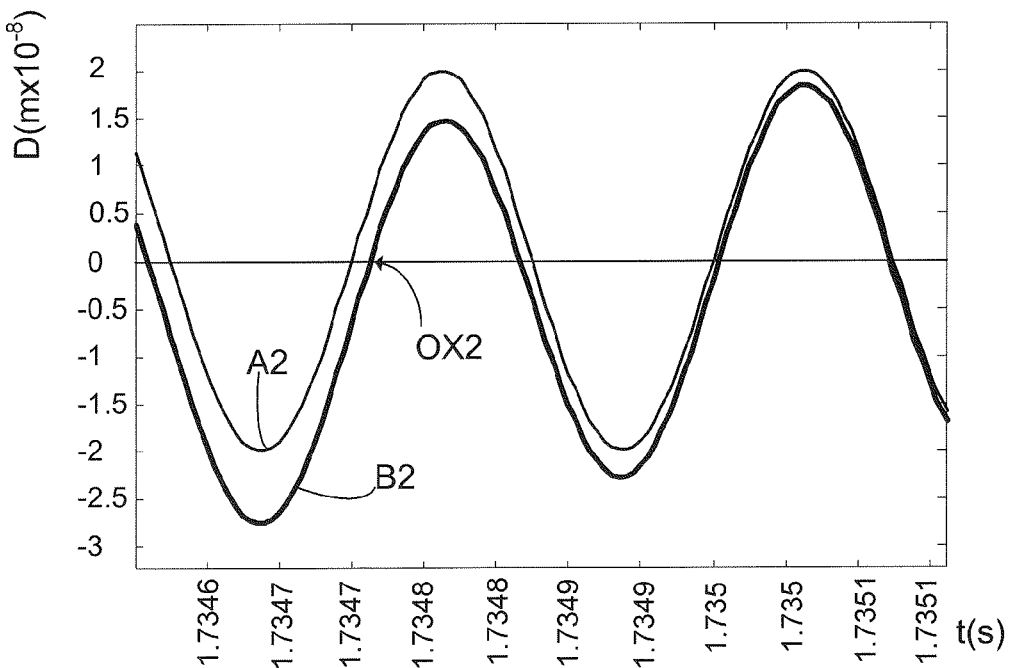
FIG. 4 depicts a graph showing a displacement over time of a substrate support according to a further embodiment of the invention.

In other words, in order to ensure that the relative table error (i.e. the error in the position of the substrate table relative to the projected image) is as close to zero as possible, a sinusoidal oscillation is applied to the projected image (or the substrate with respect to the image) at the nominal laser repetition rate, for example, 4 kHz. The timing of this extra sinusoidal oscillation or motion is such that at every nominal laser pulse instant, the added sinusoidal motion has a zero crossing. By zero crossing, it is meant that a sinusoidal graph such as shown in FIG. 3 or 4 crosses a zero line representing the middle of the oscillation between the maxima and minima of the sinusoid. At this zero crossing, the velocity of the moving table or device is at its maximum, and in the absence of positional disturbances, the tables MT, WT are (preferably perfectly) aligned (as the zero crossing is midway between the changes of direction at the maxima and minima of the sinusoid). If there are positional disturbances, the alignment of the tables MT, WT will occur at a point on the sinusoid outside of the zero crossing (or the zero crossing will effectively be moved, see FIGS. 3 and 4) and the timing of the laser pulse will coincide with the alignment (i.e. the new zero-crossing).

The amplitude of the added oscillation or sinusoidal motion is of the order of two (2) to ten (10) times the amplitude of the maximum relative table error. A maximum relative table error may, for instance, be in the region of 10 nm. In this case, therefore, the added oscillation may have a frequency of 4 kHz and an amplitude of 20 to 100 nm. The oscillation is controlled so that it is considerably shorter in duration than the exposure time of the target portion of the substrate. For example, one exposure takes approximately 60 ms, while the oscillation period imparted to the system is of the order of 0.25 ms or less. More importantly, the oscillation period is substantially equal to a nominal laser pulse firing frequency.

The oscillation may be induced by injecting an extra signal to a mask table or substrate table, as will be described below with reference to FIG. 2. The oscillation may be imparted to the radiation beam using an oscillating plane plate. In a lithographic apparatus using a reflective or catadioptric projection system, the oscillation may be imparted to the radiation beam by oscillating a reflector.

Figure 2:
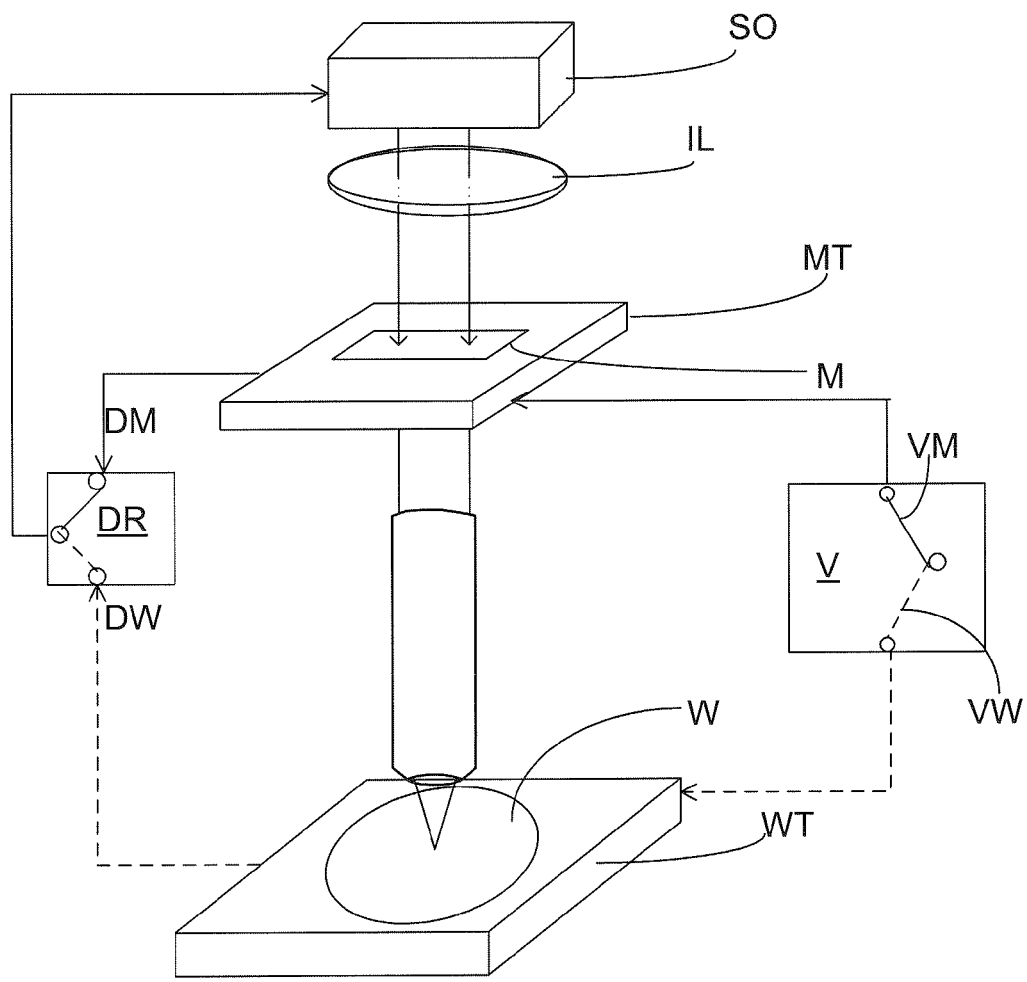
FIG. 2 depicts various portions of a lithographic apparatus according to two embodiments of the invention.

FIG. 2 shows certain portions of the lithographic apparatus of FIG. 1. Specifically, the source SO is shown to send a laser pulse through the illuminator IL and then towards a mask MA on a mask table MT. The radiation pulse passes through the mask and is thereby patterned. This patterned radiation beam then passes through the projection system PS and finally onto the substrate W surface. The substrate W is held by a substrate table or substrate support WT.

FIG. 2 further shows two switches, V and DR. The first switch V acts as an oscillation device in this embodiment. The oscillation device may not be a switch, but simply an oscillation device having a single output. This oscillation device may impart an oscillation or sinusoidal motion to either the mask table MT via output VM or to the substrate table WT via output VW, as indicated by the dashed line in FIG. 2.

Oscillations may be applied to one or both of these portions of the apparatus, or to another portion of the apparatus that will cause oscillation of the image relative to the substrate W. Of course, there may be no switch at all and simply a single output oscillator attached to any one (or more) of the devices.

The second switch of FIG. 2 functions as a detector DR. Detector DR detects the motion or the position of either the mask table MT via input DM or the motion or the position of the substrate table WT via input DW. Of course, the detector may be a single motion detector or position detector associated with a single device, rather than being a switch.

The detector feeds back information about the position of the mask table MT and/or the substrate table WT to the source SO. The source then causes a laser pulse to be fired just at the moment when the image (i.e. the patterned radiation beam), which has traveled through the mask M and the projection system PS, is as close to exactly in line with the desired position on the substrate W as possible. In this way, the pattern may more accurately be exposed onto the substrate W.

The effect of adding the extra sinusoidal motion or oscillation is that somewhere close to the nominal (i.e. default) laser timing (at which time the laser would have fired had there been no added oscillation), there is hopefully always a time instant where the relative position of the substrate with respect to the mask is exactly zero. In fact, even the oscillation of the tables or optical device may not cause an exact alignment, but it is induced in such a direction that the probability of alignment is increased relative to the case with no added oscillation. The actual laser pulse is then fired at this time instant, within acceptable tolerances. The timing for the firing of the laser pulse is shown in FIG. 3.

In FIG. 3, the actual substrate table position data may be input via a detector DR and may have, for example, a maximum position error of 8 nm. To the substrate support error, a 100 nm, 4 kHz oscillation, A, is added. FIG. 3 shows a sinusoid with its maxima and minima at 100 nm, this sinusoid being the added oscillation and is labeled "A". If the substrate support position error is zero, the laser will fire at each zero crossing OX of the clean 100 nm sinusoid, corresponding to an exact laser pulse timing of 250 µsec. In the case shown in FIG. 3, however, the laser pulse timing is adjusted based on the positional error of the substrate support. Sinusoid B shows the sum of the added oscillation and a substrate table error that starts at 8 nm and decreases over a period of about 250 µs. The difference between the two sinusoids A and B gives rise to the difference required in the laser pulse timing. In the example of FIG. 3, the laser needs to fire 2.7 µsec later than the nominal to ensure a zero position error on the substrate.

A smaller added oscillation amplitude is possible for the same substrate table error, but this would result in a requirement of a larger deviation of laser timing from the nominal value. For example, if the added oscillation has a 20 nm amplitude as shown by sinusoid A2 in FIG. 4, a 13 µsec laser timing adjustment is needed.

FIG. 4 shows the actual substrate support motion plus the added oscillation as sinusoid B2. The zero crossing OX2 is shown in the middle of the sinusoidal wave. The timing of the laser pulse is shown across the axis and it is shown that a larger deviation is from the nominal value (i.e. a larger gap along the x-axis between the sinusoids A2 and B2) is required in FIG. 4 than in FIG. 3. This is because the actual table position error is a larger proportion of the added oscillation in the example of FIG. 4 than in the example of FIG. 3.

As mentioned above with respect to FIG. 2, there are several ways of adding the oscillation to the various portions of the lithographic apparatus. A method of adding, for example, a 4 kHz oscillation is to add 4 kHz to the movement of one of the tables itself (i.e. using existing actuators). However, this would have a relatively large impact on the movement of the table and would require a large force to move the large mass of one of the tables MT, WT.

Now follows the method of calculating the laser pulse timing. A separate oscillator may alternatively be used to add an independent oscillation to either or both of the tables.

The substrate table positional error changes with relatively low frequency. Therefore, measuring the position with, for example, a 10 kHz frequency is more than enough to predict the time instant at which the relative error between the tables MT, WT is zero. In normal operation, there are position controllers that minimize the positional error of the tables and these are controlled by a control computer. With a fixed clock rate, the motion control algorithm is calculated. A typical motion controller clock rate is 5 or 10 kHz. The laser pulses are fired at a different clock rate which is determined by the capabilities of the exposure laser that is used. A typical laser pulse clock rate is 4 kHz. This difference in clock rates between the motion controllers and the laser pulses results in the laser pulse typically not coinciding with a "clock tick" of the motion controller. At a specific motion controller clock tick, it is known how much time will pass until the next laser pulse would nominally be fired. Also, at this clock tick, the position measurement data of the tables and of the oscillatory device are known. Because the rate of change of the substrate support error is much slower than the clock frequencies, the measured position deviation at a clock tick may be assumed to remain constant until the next laser firing pulse. Therefore, a laser pulse timing correction for the forthcoming laser pulse can be calculated by the motion controllers on the basis of the measured positions, and their deviations, from the desired positions. This timing correction is then sent to the laser pulse timing control electronics.

In other words, at the last motion controller clock tick before the nominal laser pulse time instant, the required pulse timing variation is calculated.

As mentioned above, in FIG. 3, sinusoid B shows the added oscillation plus a substrate table error with maximum value 8 nm. The difference between the two graphs A and B gives rise to the difference required in the laser pulse timing. The above method may be applied to positional errors in the x-axis, the y-axis, or even in both. The method is best suited for errors in only one of the x and y axes because it is unlikely that these are both zero at the same moment. However, to deal with both x and y errors, oscillation in a combined x/y direction is possible. Instead of considering only the x axis or only the y axis, the time instant may be selected that minimizes the vectorial error $\sqrt{x^2+y^2}$.

The advantages of the invention are now discussed. The image positional error on the substrate at the moment of the laser pulse is decreased, leading to smaller mean average (MA) and mean standard deviation (MSD) values (i.e. smaller high frequency and low frequency errors) and hence better overlay and critical dimension measurements. This method allows the use of less accurate table positioners, for example using only a long-stroke actuator in the scanning of the substrate table WT. This greatly reduces table complexity and cost. Finally, the use of the oscillation in combination with the adjusted laser pulse timing allows the throughput of the substrate(s) not to be compromised for the sake of accuracy.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Various embodiments of the present invention have been described above. It should be understood that they have been presented by way of example only, and not limitation. It will be apparent to persons skilled in the relevant art that various changes in form and detail can be made from those specifically described without departing from the spirit and scope of the invention. Thus, the breadth and scope of the present invention should not be limited by any of the above-described exemplary embodiments, but should be defined only in accordance with the following claims and their equivalents.

The descriptions above are intended to be illustrative, not limiting. Thus, it will be apparent to one skilled in the art that modifications may be made to the invention as described without departing from the scope of the claims set out below.

What is claimed:

1. A lithographic apparatus comprising:
    an illumination system configured to condition a radiation beam and to provide the radiation beam in pulses;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    an oscillation device configured to impart a controlled oscillation perpendicular to an optical axis of the projection system to at least one of the patterning device support and the substrate table to align the patterned radiation beam and the substrate,
    wherein the controlled oscillation has a timing such that a period of the controlled oscillation is less than an exposure time of the target portion of the substrate and is substantially equal to a nominal frequency of the pulses.

2. A lithographic apparatus according to claim 1, wherein the controlled oscillation has a period of less than half of a duration of an exposure of the target portion of the substrate.

3. A lithographic apparatus according to claim 1, wherein:
    the substrate table is configured to move according to a motion profile such that the patterned radiation beam is projected at intervals along the motion profile with respect to the substrate surface; and
    the oscillation device is configured to superimpose the controlled oscillation onto the substrate table motion profile.

4. A lithographic apparatus according to claim 1, wherein the oscillation device is configured to oscillate the patterned radiation beam relative to the substrate.

5. A lithographic apparatus according to claim 1, wherein the oscillation device is configured to impart an oscillation with a sinusoidal behavior, and in response to the sinusoidal behavior having an equal amplitude on either side of a zero-axis, the illumination system is configured to time the pulse of the radiation beam such that the radiation beam is projected onto the substrate substantially during a crossing of the zero-axis by the controlled oscillation.

6. A lithographic apparatus according to claim 1, wherein the oscillation device is configured to impart a controlled oscillation with an amplitude in the range of from 2 to 10 times the amplitude of a maximum substrate table control error.

7. A lithographic apparatus according to claim 1, wherein the oscillation device is configured to impart a controlled oscillation with an amplitude in the range of from 20 to 100 nm.

8. A lithographic apparatus according to claim 1, wherein the oscillation device comprises an actuator configured to oscillate at a predetermined frequency at least one of the patterning device support and the substrate table.

9. A lithographic apparatus according to claim 1, further comprising a relative position detector for detecting a relative position of the patterned radiation beam and the substrate.

10. A lithographic apparatus according to claim 9, wherein the relative position detector comprises:
   an individual position detector for at least one of each of the patterning device support, the substrate table and an optical element; and
   a processor for calculating a relative error between each of the individual position detector outputs.

11. A lithographic apparatus according to claim 9, wherein:
   the relative position detector is configured to transmit information regarding the relative position of the patterned radiation beam and the substrate to the illumination system; and
   the illumination system is configured to cause the timing of a pulsing of the radiation beam to coincide with the alignment of the patterned radiation beam and the substrate.

12. A lithographic apparatus according to claim 1, wherein the substrate table is constructed to oscillate at a timing such that the radiation beam pulses onto the substrate at a timing in middle of an oscillation of the substrate table, in response to the oscillation crossing a zero-axis, the zero-axis being defined as an axis about which the amplitude of sinusoidal oscillation is equal.

13. A lithographic apparatus according to claim 1, wherein the oscillation device is configured to cause a controlled oscillation at a frequency of approximately 4 kHz.

14. A lithographic apparatus according to claim 1, wherein the oscillation device is configured to cause controlled oscillation in either an x-direction in the plane of the substrate, a y-direction in the plane of the substrate, or in a vectorial combination of both the x- and y-directions.

15. A lithographic apparatus comprising:
   an illumination system configured to condition a radiation beam and to provide the radiation beam in pulses;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate;
   an oscillation device configured to impart a controlled oscillation perpendicular to an optical axis of the projection system to at least one of the patterning device support and the substrate table to align the patterned radiation beam and the substrate,
   wherein the controlled oscillation has a timing such that a period of the controlled oscillation is less than an exposure time of the target portion of the substrate and is substantially equal to a nominal frequency of the pulses; and
   a relative position detector configured to detect a relative position between the patterned radiation beam and the target portion of the substrate,
   wherein the illumination system is further configured to impart a timed pulse to the radiation beam, the pulse being timed to coincide with a minimal positional offset between the patterned radiation beam and the target portion of the substrate.

16. A method of projecting a patterned radiation beam in pulses onto a substrate comprising imparting a controlled oscillatory motion to at least one of a patterning device support and a substrate table to align the patterned radiation beam and the substrate, the oscillatory motion being in a direction perpendicular to a direction of projection of the projected patterned radiation beam and comprising a period that is less than an exposure time of a target portion of the substrate and is substantially equal to a nominal frequency of the pulses.

17. A method according to claim 16, wherein a pulse of the patterned radiation beam is synchronized with a timing in the controlled oscillatory motion in which the relative velocity of the patterned radiation beam and the substrate is substantially constant.

18. A device manufacturing method comprising:
   projecting a patterned beam of radiation onto a substrate; and
   oscillating at least one of a patterning device support and a substrate table in a direction perpendicular to a projection direction of the patterned beam of radiation, in order to align an image of the patterned radiation beam and the substrate,
   wherein the controlled oscillation has a timing such that a period of the controlled oscillation is less than an exposure time of the target portion of the substrate and is substantially equal to a nominal frequency of pulses of the radiation beam.

* * * * *